United States Patent
Ramm et al.

[11] Patent Number: 5,877,034
[45] Date of Patent: Mar. 2, 1999

[54] METHOD OF MAKING A THREE-DIMENSIONAL INTEGRATED CIRCUIT

[75] Inventors: Peter Ramm, Pfaffenhofen; Reinhold Buchner, Unterföhring, both of Germany

[73] Assignee: Fraunhofer Gesellschaft zur Foerderung der angwandten Forschung e.V., Munich, Germany

[21] Appl. No.: 532,368

[22] Filed: Sep. 22, 1995

[30] Foreign Application Priority Data

Sep. 22, 1994 [DE] Germany ............... 44 33 833.3

[51] Int. Cl.⁶ .................................................. H01L 21/66
[52] U.S. Cl. .......................... 438/15; 438/459; 438/464
[58] Field of Search ............... 437/8, 21, 40 TFT, 437/41 TFT, 51, 86, 226, 227, 915, 974; 148/DIG. 12, DIG. 135, DIG. 164; 438/15, 17, 152, 153, 164, 406, 458, 459, 464

[56] References Cited

U.S. PATENT DOCUMENTS

| | | | |
|---|---|---|---|
| 4,939,568 | 7/1990 | Kato et al. | 357/75 |
| 4,954,875 | 9/1990 | Clements | 357/75 |
| 5,087,585 | 2/1992 | Hayashi | 437/51 |
| 5,104,820 | 4/1992 | Go et al. | 437/51 |
| 5,192,716 | 3/1993 | Jacobs | 437/974 |
| 5,256,562 | 10/1993 | Vu et al. | 437/86 |
| 5,324,687 | 6/1994 | Wojnarowski | 437/974 |
| 5,376,561 | 12/1994 | Vu et al. | 437/915 |
| 5,434,433 | 7/1995 | Takasu et al. | 259/59 |
| 5,455,202 | 10/1995 | Malloy et al. | 437/974 |
| 5,489,538 | 2/1996 | Rostoker et al. | 437/226 |
| 5,591,678 | 1/1997 | Bendik | 437/915 |

OTHER PUBLICATIONS

Tewksbury et al., IEEE Circuits and Devices Magazine (Sep. 1989) p. 22.
Akasaka, Y., Proc.IEEE 74 (1986) p. 1703.
Y. Hayashi et al., IEEE Symp. on VLSI Technol. 1990, p. 95 "Fabrication of 3D IC using CUBIC . . . ", 1990.

*Primary Examiner*—Chandra Chaudhari
*Attorney, Agent, or Firm*—Karl Hormann

[57] ABSTRACT

A method of making a three-dimensional integrated circuit by transferring fully processed devices from a device layer of first substrate to an auxiliary substrate, separating the auxiliary substrate and the devices thereon into individual chips, testing the chips for their functionality and mounting functioning chips on a carrier substrate in a side-by-side arrangement to form a device layer therein and thereafter mounting a further device layer on said device layer of said carrier substrate. Electrical inter-connection are formed between the devices of said to layers through passage ways in their respective substrates.

19 Claims, 3 Drawing Sheets

METHOD OF MAKING A THREE-DIMENSIONAL INTEGRATED CIRCUIT

CROSS-REFERENCE TO RELATED APPLICATION

The subject matter of the present application relates generally to that of copending application Ser. No. 08/532,858=DE P 44 33 845.7 (Attorney Docket 950124) and 08/532,367=DE P 44 33 846.5 (Attorney Docket 950125) both filed contemporaneously herewith.

BACKGROUND OF THE INVENTION

1. Field of the Invention

The invention, in general, relates to a method of making a three-dimensional integrated circuit and, more particularly, to a method providing high system yields in the fabrication of three-dimensional integrated circuits.

As used herein, the term three-dimensional integration is intended to connote the vertical interconnection of devices fabricated by planar technology. The advantages of a three-dimensionally integrated microelectronic system are, among others, that with substantially identical design rules, higher package densities and switching rates may be obtained as compared to two-dimensional systems. This is the result of shorter wiring paths or interconnections between individual devices or circuits and of the possibility of parallel data processing. The increased efficiency of the system is optimized by utilizing interconnection technology offering vertical interconnections which are freely selectable as to their positioning and which are suitable for very large-scale integration (VLSI).

2. The Prior Art

The following methods of fabricating three-dimensional circuit arrangements with freely selectable vertical contacts are known:

Y. Akasaka, Proc. IEEE 74 (1986), p. 1703, suggests depositing and recrystallizing polycrystalline silicon on a fully processed device layer so that further devices may be formed in the recrystallized layer. The disadvantages of such a method reside in the yield-reducing degradation of the devices in the lower level because of the high thermic stress induced by the recrystallization process and because of the necessarily serial processing of the overall system. They lead to correspondingly long cycle times during fabrication as well as to reduced yields because of accumulating process-inherent rejects. Both increase manufacturing costs significantly as compared to processing individual layers in separate substrates.

Y. Hayashi et al., Proc. 8th Int. Workshop on Future Electron Devices, 1990, page 85, proposes initial fabrication of separate device in separate substrates. Thereafter the substrates are reduced in their thickness to a few micrometers, provided with front and back leads and connected to each other by a bonding process. Special processes such as MOS-incompatible materials, for instance, gold, and patterning or structuring the back surface of the substrate, not provided for in standard fabrication techniques of semiconductors such as, for instance, complementary metal oxide semiconductors (CMOS) are, however, required to provide the front and back leads.

U.S. Pat. No. 4,939,568 describes a method of fabricating a three-dimensional integrated circuit structure by stacking individual ICs on a substrate to form a chip stack. To this end, a substrate provided with fully processed ICs is first divided into unit chips, whereby processing at the wafer level is completed. The chips are tested (wafer sorted), and a first unit chip is mounted on a substrate by thermocompression. Following this step, another chip is mounted (piggy-backed) in the same manner to the first chip. Hence, a first chip stack will be finished before fabrication of a further chip stack on another substrate can be begun. Further processing of the chip stack is, therefore, not possible at the wafer level.

A serious disadvantage of the aforementioned methods derives from the fact that equipment available in silicon technology lends itself only to processing of the discshaped or sliced substrates, known as wafers. Processing of substrates differing therefrom, especially of individual chips, can be performed with experimental test equipment only; but it is not possible on an industrial fabrication scale with its required high yields.

U.S. Pat. No. 4,954,875 describes a method of three-dimensional integration by stacking individual wafers, in which the interconnection between individual device planes is provided by specially formed vias. By combining substrates containing a plurality of identical devices, viz.: chips, the resulting yield of a multi-layer system is derived from the product of the individual yields. This leads to a drastically reduced yield in a system including several device planes, such as a system made in accordance with the method of U.S. Pat. No. 4,954,875. Thus, at a yield of 80% of an individual plane, the resulting total yield of a system combined of ten layers is but 10%, making such a system uneconomical. Accordingly, such technology is restricted to a few specialized applications. The yield of a device substrate is also dependant upon its circuit species and its fabrication process. Very high yields are obtained, for example, in the field of memory components, whereas markedly lower yields are obtained in logic devices, such as microprocessors. Particularly where different species of such circuits are stacked together, the total yield is disproportionately determined by that species of circuit providing the lowest yield.

OBJECTS OF THE INVENTION

It is an object of the invention to provide a novel method of making a three-dimensional integrated circuit which utilizing conventional standard industry equipment, provides markedly higher yields on the wafer level, relative to hitherto known methods.

Other objects will in part be obvious and will in part appear hereinafter.

BRIEF SUMMARY OF THE INVENTION

In a preferred embodiment of the invention, these and other objects are accomplished by a method providing a high systemic yield in the fabrication of a three-dimensional integrated circuit which comprises the steps of: providing a first substrate which at a first surface is provided with at least one fully processed device plane containing a plurality of independent devices or circuits in a side-by-side arrangement, wherein the devices or circuits of a plurality of device planes form a device stack; testing individual devices, device stacks or circuits of the first substrate to distinguish between functioning and defective devices, device stacks or circuits; connecting an auxiliary substrate to the first surface of the substrate; thinning or removing material from the first substrate at its surface opposite the first surface; separating the auxiliary substrate with the devices connected thereto into individual chips each containing functioning or defective devices, device stacks or circuits; providing a carrier substrate; aligning and mounting only chips containing functional devices, device stacks or circuits in a side-by-side arrangement on the carrier substrate; removing the auxiliary substrate; planarizing moats created between individual chips after their aligned mounting; and depositing at least one other device plane on the device planes of the carrier substrate.

BRIEF DESCRIPTION OF THE SEVERAL DRAWINGS

The novel features which are considered to be characteristic of the invention are set forth with particularity in the appended claims. The invention itself, however, in respect of its structure, construction and lay-out as well as manufacturing techniques, together with other objects and advantages thereof, will best be understood from the following description of preferred embodiments when read in connection with the appended drawings, in which:

DETAILED DESCRIPTION OF PREFERRED EMBODIMENTS

Figure 1:
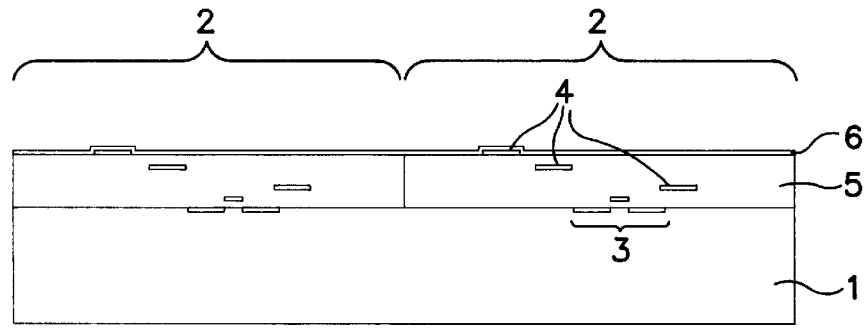
FIG. 1 depicts a first device substrate including circuit structures and metallization planes.
Figure 2:
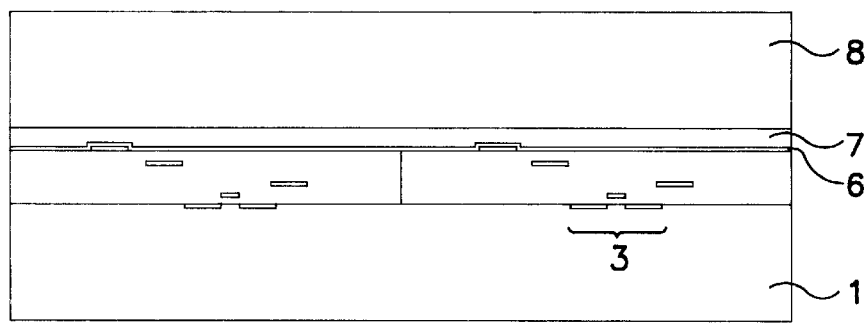
FIG. 2 depicts the device substrate of FIG. 1 including an adhesion layer and an auxiliary substrate.

With reference to FIG. 1, a first device substrate 1 also known as a wafer and made, for instance, of monocrystalline silicon, includes a plurality of usually identical chips 2 arranged in a defined pattern or design and which include such circuit structures 3 as, for instance, a metal oxide semiconductor (MOS) transistor and one or more metallization planes 4. Usually, the metallization planes 4 consist of aluminum, aluminum alloy or other materials, such as copper or tungsten, and are surrounded, for purposes of electrical insulation, by an oxide layer 5. For purposes of planarization, the oxide layer 5 may be doped with boron and/or phosphorus. As shown in FIG. 1, the uppermost metallization plane 4 may also be covered by a passivation layer 6 of, for instance, silicon oxide or silicon nitride. Furthermore, alignment structures (not shown in FIG. 1) are provided for connecting several substrates in precise alignment with each other. The thickness of the wafer below the circuit structures 3 measures 625 μm, for instance. The device substrate 1 is the bottom substrate of a multi-layer system (FIG. 1).

Upon completion of the device substrate 1 the passivation layer 6 on the uppermost metallization plane is opened at predetermined test positions. The individual chips of the substrate are then subjected to a functioning (wafer sorting) test, and any defective chips are marked (for instance by an ink drop). Thereafter, a new passivation layer is deposited to protect the exposed test sites again.

An adhesion layer 7 of organic material, such as polyimide or a photoresist, is applied over the entire surface of the substrate 1. The adhesion layer 7, which typically has a thickness of 1–2 μm, may also planarize the surface. Finally, an auxiliary substrate 8, such as a silicon or quartz wafer, is adhesively applied to the adhesion layer 7. The auxiliary substrate 8 serves as a handling substrate during subsequent process steps and protects the surface of the device substrate 1 during such further processing.

Thereafter, the back surface of the device substrate 1 is thinned or reduced by etching and/or grinding, so that the thickness of the substrate 1 below the circuit structures 3 will measure but a few micrometers, typically 1–5 μm. The selected residual thickness is, however, also dependant upon the species of circuits embedded in the substrate.

Figure 3:
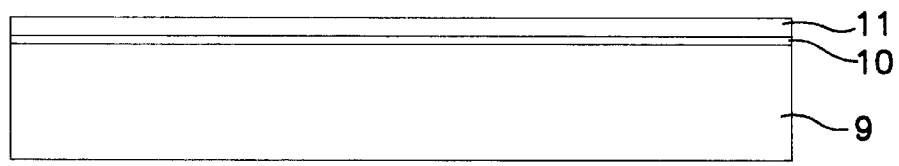
FIG. 3 depicts a carrier substrate including an adhesion layer.

A carrier substrate 9, made, for instance, of mono- or polycrystalline silicon and, if desired, covered by an insulating layer 10 of silicon oxide, contains no circuit structures. An adhesion layer 11 made, for instance, of polyimide or a photoresist, will be applied to the carrier substrate 9 (FIG. 3).

Figure 4:
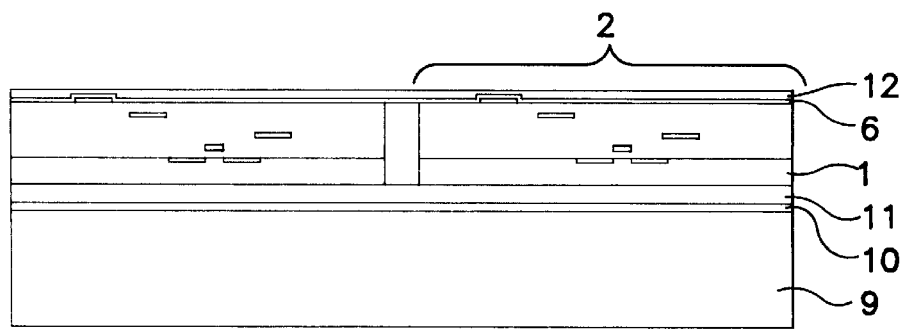
FIG. 4 depicts a carrier substrate including a first device plane of individually applied chips, following planarization of its surface.

Following this, the device substrate 1 with the handling substrate 8 thereon will be divided into individual chips. This may be done by an etching process, by sawing or with a laser. Functioning chips 2, marked or unmarked, as the case may be, are then mounted and aligned on the carrier substrate 9 in a side-by-side arrangement and predetermined lay-out. The handling substrate 8 is then removed by etching or grinding, and the entire exposed adhesion layer 7 is removed, typically by an oxygen plasma or a solvent. After the chips 2 have been adhesively connected to it, the surface of the carrier substrate 9 with the device substrates 1 thereon will show moats between individual chips 2 which have a very low aspect ratio. These moats will be filled by a planarization step during which a layer 12 (for instance an oxide applied by chemical vapor deposition) is deposited to provide a smooth planar surface. The passivation layer 6 may act as a barrier layer during the etching or grinding operations. The carrier substrate 9 with the first device plane mounted on it may now be further processed like a common silicon wafer, with standard technology equipment (FIG. 4).

Figure 5:
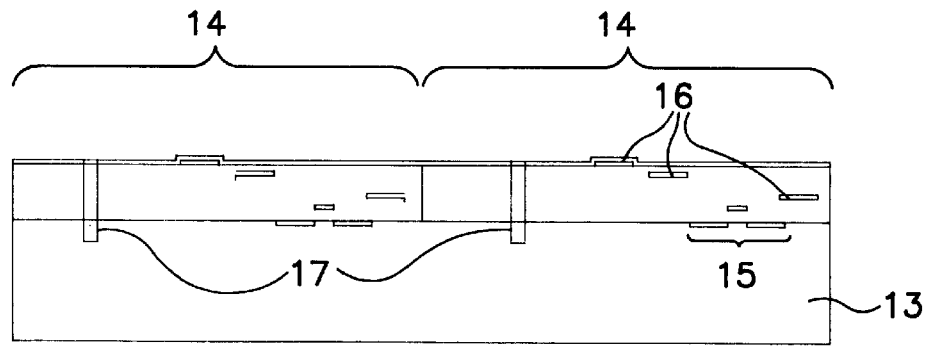
FIG. 5 depicts a second device substrate including circuit structures and metallization planes.

A second device substrate or wafer 13 also includes a plurality of usually identical chips 14 arranged in a predetermined pattern and containing circuit structures 15, such as, for instance, a MOS-transistor, as well as one or more metallization planes 16. The structure of the substrate 13 is substantially identical to the structure of the first device substrate 1; but its circuit structures 15 are different as regards their functions. Furthermore, the second device substrate 13 is provided with via holes 17 in those positions where electrical interconnections or contacts are subsequently to be established with underlying circuit structures. The via holes 17 are of sufficient depth to extend below the layer containing the circuit structures 15 (FIG. 5).

Figure 6:
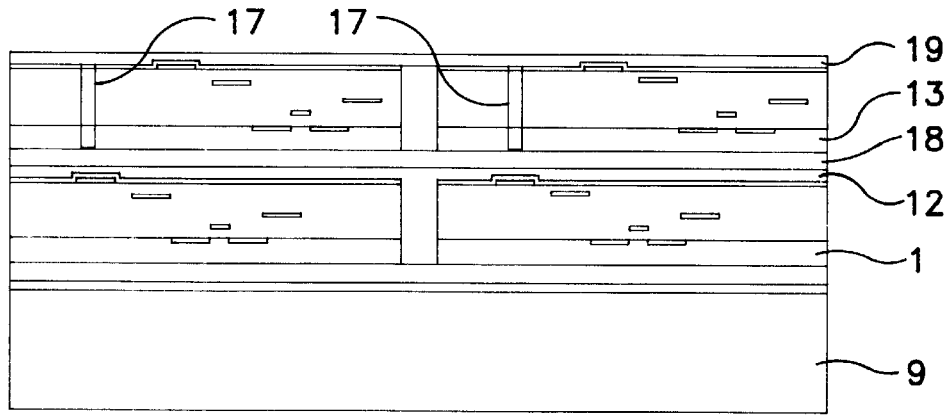
FIG. 6 depicts a carrier substrate including two device planes of individually applied chips, following planarization of its surface.

The device substrate 13 is also subjected to a functioning (wafer sort) test. Defective chips are marked, and adhesion and auxiliary layers are applied in the same manner as described supra. The thickness of the device substrate 13 is also reduced, as by etching and/or grinding off its back surface, down to the via holes 17. The second device substrate 13 with the handling substrate thereon is then divided into individual chips, and functioning chips 14 are aligned and mounted onto the carrier substrate 9, on top of the first device plane 1 provided with an adhesion layer 18. The adhesion layer 18, typically measuring about 1–2 μm in thickness, may effect a planarization of the surface. Following this, the handling substrate is removed by etching or grinding, and the entire exposed adhesion layer is removed as well. Another planarization step is performed by depositing, as by chemical vapor deposition (CVD) of an oxide, a layer 19 to provide a smooth planar surface (FIG. 6).

Figure 7:
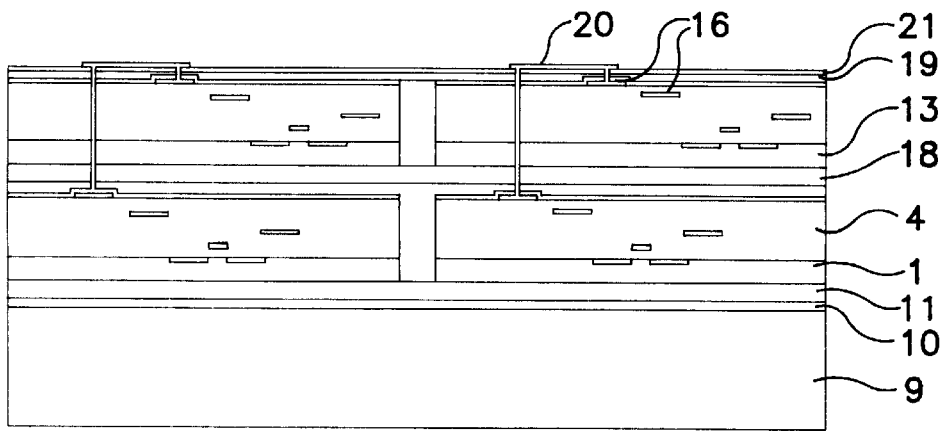
FIG. 7 depicts a carrier substrate including two vertically interconnected device planes.

A vertical interconnection 20 is then fabricated between the metallization plane 4 and 16 of the upper (substrate 1) and lower (substrate 13) device layers, respectively. To this end, a contact hole extending between a metallization plane 16 in the upper device layer and the prepared via holes 17 and the metallization layer 4 of the lower device layer, is opened by a photolithographical process. An electrical interconnection is provided by metal precipitation and structuring. Finally, a passivation layer 21 is deposited on the surface (FIG. 7).

It will be apparent to persons skilled in the art that the electrical interconnection may be established differently. For instance, it may be provided by front and back surface leads provided for this purpose at the same time as the chips are mounted on the lower substrate (see: Introduction to the report by Y. Hayashi et al.).

Figure 8:
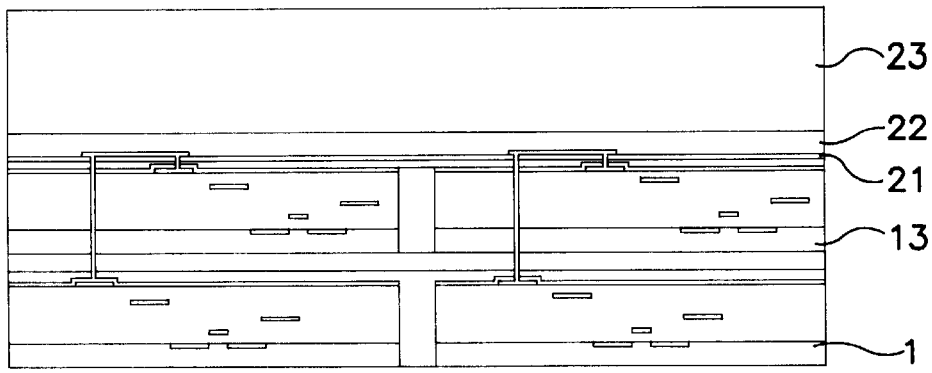
FIG. 8 depicts an auxiliary substrate including two vertically interconnected device planes following removal of a carrier substrate.

If it is desired to mount a further device plane, the existing two-layer system will be subjected to a functioning (wafer sort) test, and any defective chips will be marked. Thereafter, a passivation layer is deposited over the entire surface in order to protect the surface. In the manner previously described, an adhesion layer 22 and an auxiliary layer 23 are then deposited. The carrier substrate 9 including the insulation layer 10 and the adhesion layer 11 below the first device plane (substrate 1) are removed by etching and/or grinding off beginning at the backside (FIG. 8)

The carrier substrate may also be removed by etching away the adhesion layer 11, and may subsequently be used again as a carrier substrate for any subsequent processing.

Figure 9:
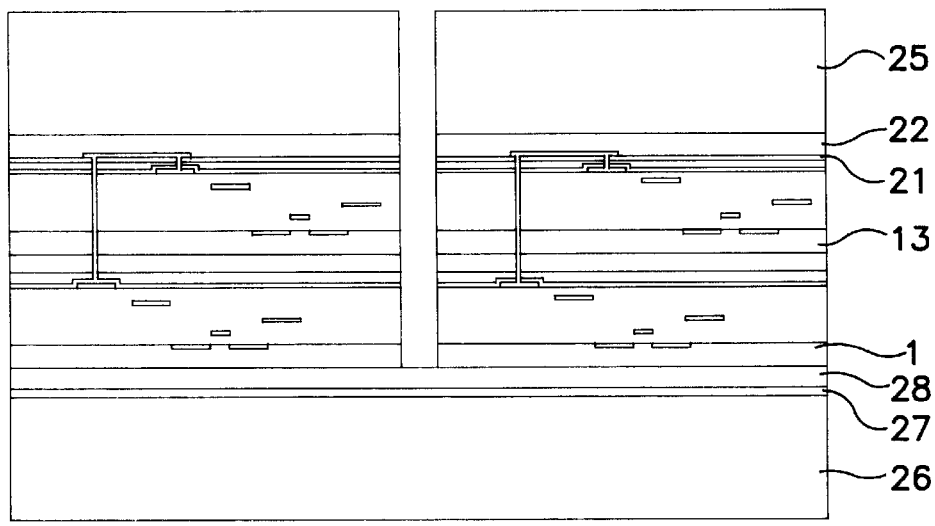
FIG. 9 depicts a carrier substrate including two device stacks applied as individual chips and consisting of two device planes, including the auxiliary substrates.

Thereafter, the auxiliary substrate 23, together with the two device planes, is divided into individual chips (partial stacks) 24, whereupon the marked and functioning chips are aligned and mounted on a new carrier substrate 26 which may be provided with an insulation layer 27 and an adhesion layer 28 (FIG. 9).

Figure 10:
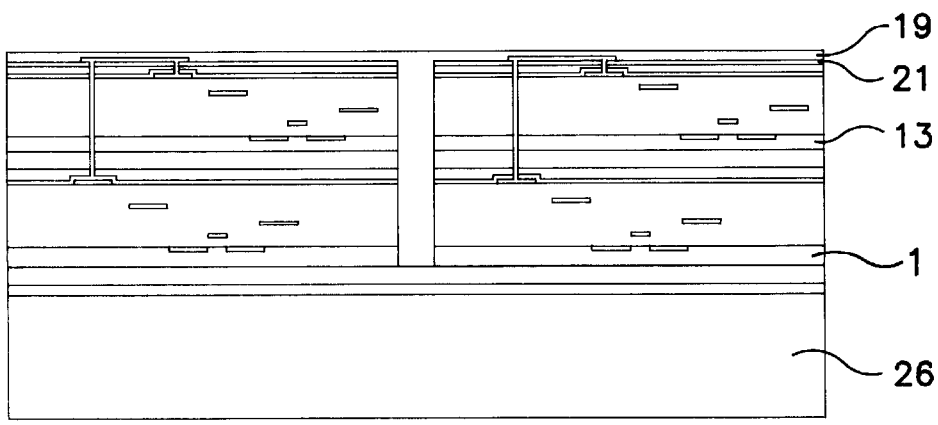
FIG. 10 depicts a carrier substrate including two device stacks applied as individual chips, following planarization of its surface.

The handling substrates 25, i.e. the divided handling substrate 23, will then be removed by etching and/or grinding, and the entire surface of the adhesion layer 22 will also be removed. After removal of the layer 29 (for instance, an oxide deposited by chemical vapor deposition), a planarization step is executed to provide a smooth planar surface. In this manner, the resultant substrate will have two device planes or layers containing only fully functional chips (FIG. 10).

Further device planes may be added in an analogous manner, and each time only functional partial systems will be utilized.

As will have been seen from the foregoing description, to construct systems including a plurality of device planes, an additional carrier substrate containing no device structures is utilized. A fully processed substrate including circuit structures and metallization planes is subjected to a functioning (wafer sort) test to segregate functioning chips of the substrate. This substrate is subsequently connected with an auxiliary substrate, is reduced in its thickness from its back surface, and is separated into individual chips. As an alternative to thinning the substrate down to near its device structures, in the case of SOI—(silicon on insulator) substrates the portion of the substrate below the oxide layer may be removed. Thereafter, selected functioning chips will be connected to the carrier substrate, for instance by an adhesion layer, in a side-by-side arrangement and in a predetermined layout. The chips will thus be assembled as a new chip plane on the carrier substrate. In this manner a wafer is provided which in its device plane contains only functioning devices and circuit structures. Finally, the (divided) auxiliary substrate will be removed.

Since only individual chips will have been attached to the carrier substrate, because of moats between the chips, there would no longer exist an uninterrupted surface. Because of this, certain processing steps, especially photolithographic modules, can no longer be performed with any high yield. For this reason, a planarization step is preferably interposed at this stage. Thereafter, the substrate which in its device plane contains tested and functioning chips only, may be further processed in conventional fabrication equipment.

Planarization may be accomplished in different ways. To start, an insulation layer, for instance, spun-on glass or an oxide layer deposited by chemical vapor deposition, is applied to fill in any moats. Thereafter, the surface is smoothed as by etching or mechanical or chemo-mechanical grinding.

Further processes which cannot be executed at the chip level, can, following the planarization step, be performed without any problem on the carrier substrate containing preselected chips.

After completion of a first device plane, a further device plane may be added in a similar chip-wise manner, i.e. by individually mounting chips and by planarizing the surface.

Thereafter, electrical interconnections may be provided between a metallization layers in the upper and lower circuit planes. This may be accomplished by etching the via holes which were previously provided during processing of the individual substrates, through to a metallization layer. For purposes of structuring, a photo mask is aligned on each individual chip by alignment structures, to compensate for any deviations in tolerances resulting from the individual mounting of the chips and to obtain a high degree of precision alignment.

If it is desired to add another device plane, the existing partial stack, (i.e. the original carrier substrate with all the device planes thus far mounted on it) is tested for its functioning. An auxiliary substrate is applied to it and the original carrier substrate is removed. The auxiliary substrate with the device planes thereon is separated into individual chips. The functioning chips are connected by an adhesion layer to a new carrier substrate, the auxiliary substrates are removed and the surface is planarized. Thereafter, a further device plane will be similarly attached in a chip-wise manner, its surface will be planarized and electrical interconnections will be established.

The method in accordance with the invention is not limited in respect of the number of planes which may be stacked together. Furthermore, it is not only single planes which may be mounted in a chip-wise manner, but as partial stacks comprising a plurality of planes.

Substrates useful for practicing the present invention include monocrystalline silicon substrates, silicon-on-insulator (SOI)—substrates, as well as substrates of different technological families, such as, for instance, semiconductors utilizing elements of groups III–V of the periodic table. Aside from mono- or polycrystalline silicon substrates which may be provided with an insulation layer, such as silicon oxide, substrates made of other materials compatible to semiconductor processes, such as, for instance, quartz or glass, are also appropriate. Advantageously, the thermal expansion coefficients of carrier substrate and device substrate are coordinated to keep mechanical stresses resulting from temperature cycles inherent in process operations at a minimum. In view of the fact that the device substrates contain metallization planes, usually with an aluminum or aluminum alloy content, any succeeding process steps are as a rule limited to maximum temperatures of about 400° C. The adhesion layer may additionally act as a buffer layer to reduce mechanical stress, or as a passivation layer. Furthermore, the adhesion layer may in effect planarize the surface. The adhesion layer may be an organic material such as polyimide or a photoresist.

The process steps of the method for fabricating a three-dimensional integrated circuit are all well-know and proven operations, so that there is no need for devising new processes.

The method in accordance with the invention is well suited for fabricating multi-layered systems. Since only pre-tested elements are being utilized and since only functioning partial stacks are utilized for further processing, functioning chips will never be mounted on defective device stacks and thus become useless. In this manner the total yield of the system is advantageously increased, so that a significant decrease in manufacturing costs can be realized.

What is claimed is:

1. A method of making a three-dimensional integrated circuit, comprising the steps of:
   a) providing a first substrate provided at a first surface thereof with at least one first fully processed device layer comprising a plurality of first independent devices arranged in side-by-side relationship;
   b) testing said first independent devices for functionality and marking them to distinguish between functioning and defective devices;
   c) connecting a first auxiliary substrate to said first device layer;
   d) reducing the thickness of said first substrate from its surface opposite said first surface;
   e) separating said first auxiliary substrate and said first devices thereon into individual first components;
   f) providing a carrier substrate;
   g) aligning and mounting only first components with functioning first devices in side-by-side arrangement on said carrier substrate thereby to form thereon a second device layer provided with moats between adjacent components;
   h) removing said auxiliary substrate;
   i) planarizing said second device layer and said moats between said functioning first devices; and
   j) mounting at least one other device layer comprising second devices on said second device layer on said carrier substrate.

2. The method of claim 1, wherein said first devices include circuit structures.

3. The method of claim 2, wherein said first surface is provided with a plurality of device layers in superposition and wherein said devices and said circuit structures in said plurality of said device layers form device stacks.

4. The method of claim 3, wherein said step of mounting at least one other device layer on said second device layer on said carrier substrate comprises the steps of:
   a) providing a second substrate provided on one of its surfaces with at least one third device layer comprising a plurality of second independent devices in a side-by-side arrangement;
   b) testing and marking said second independent devices to distinguish between functioning and defective second devices;
   c) connecting a second auxiliary substrate to said third device layer;
   d) reducing the thickness of said second substrate from its surface opposite said one surface;
   e) separating said second auxiliary substrate and said third devices into individual second components;
   f) aligning and mounting only functioning functional second components in a side-by-side arrangement with each other and in registry with said first components on said second device layer on said carrier substrate thereby forming a forth device layer with moats between adjacent second components;
   g) removing said second auxiliary substrate; and
   h) forming electrical interconnections between said second and said first devices of said second device layer.

5. The method of claim 4 for making a three-dimensional integrated circuit comprising more than two superposed device layers, wherein said first substrate comprises said carrier substrate provided with a plurality of device layers mounted thereon by the steps of said method previously performed thereon.

6. The method of claim 5, wherein said carrier substrate is repeatedly utilized.

7. The method of claim 6, wherein said first and second auxiliary substrates are respectively connected to said first and third device layers by adhesion layers.

8. The method of claim 7, wherein said first and second devices are respectively mounted on said carrier substrate and said second device layer by adhesive layers.

9. The method of claim 8, wherein said adhesive layers effect passivation of the respective surfaces of said carrier substrate and said device layer thereof.

10. The method of claim 9, wherein said adhesive layers effect planarization of said respective surfaces of said carrier substrate and said device layer thereof.

11. The method of claim 10, further comprising the step of planarizing said formed moats between first and second devices.

12. The method of claim 11, wherein said electrical interconnections between said first devices and second devices are formed through passage ways.

13. The method of claim 12, wherein said reduction in thickness of said first and second substrates is provided by etching.

14. The method of claim 13, wherein said reduction in thickness of said first and second substrates is provided by grinding.

15. The method of claim 14, wherein said first and second auxiliary substrates are removed by etching away of their respective adhesion layers.

16. The method of claim 14, wherein said carrier substrate comprises a material of a group including a semiconductor material, quartz and glass.

17. The method of claim 16, wherein said auxiliary substrates comprise a material of the group including a semiconductor material, quartz and glass.

18. The method of claim 17, wherein one of said first and second substrates comprises an SOI-substrate.

19. The method of claim 2, wherein said circuit structures are covered by a passivation layer and wherein said testing is conducted by at least temporary removal of said passivation layer.

* * * * *